United States Patent
Huang et al.

(10) Patent No.: US 10,411,745 B1
(45) Date of Patent: Sep. 10, 2019

(54) BROADBAND IMAGE-REJECT RECEIVER FOR MULTI-BAND MILLIMETER-WAVE 5G COMMUNICATION

(71) Applicant: SPEEDLINK TECHNOLOGY INC., Cupertino, CA (US)

(72) Inventors: Min-Yu Huang, Atlanta, GA (US); Hua Wang, Atlanta, GA (US); Thomas Chen, Atlanta, GA (US); Taiyun Chi, Atlanta, GA (US)

(73) Assignee: SPEEDLINK TECHNOLOGY INC., Cupertino, CA (US)

( * ) Notice: Subject to any disclaimer, the term of this patent is extended or adjusted under 35 U.S.C. 154(b) by 0 days.

(21) Appl. No.: 15/946,716

(22) Filed: Apr. 5, 2018

(51) Int. Cl.
*H04B 1/26* (2006.01)
*H03F 3/195* (2006.01)
*H03F 3/45* (2006.01)
*H03G 3/30* (2006.01)

(52) U.S. Cl.
CPC .............. *H04B 1/26* (2013.01); *H03F 3/195* (2013.01); *H03F 3/45179* (2013.01); *H03G 3/3042* (2013.01); *H03F 2200/171* (2013.01); *H03F 2200/294* (2013.01); *H03F 2200/336* (2013.01); *H03F 2200/387* (2013.01); *H03F 2200/451* (2013.01)

(58) Field of Classification Search
CPC ...... H03D 7/14; H03D 7/1441; H03D 7/1458; H03D 7/1466; H03D 7/1475; H03D 7/1483; H03D 7/1491; H03D 3/007
USPC ......................................... 455/326, 213, 307
See application file for complete search history.

(56) References Cited

U.S. PATENT DOCUMENTS

| | | | | |
|---|---|---|---|---|
| 6,057,714 A | * | 5/2000 | Andrys | H03D 9/0675 327/105 |
| 9,837,194 B1 | * | 12/2017 | Folker | H01F 3/14 |
| 2006/0019625 A1 | * | 1/2006 | Puglia | H03B 21/02 455/260 |
| 2006/0057983 A1 | * | 3/2006 | Thompson | H03D 7/1441 455/127.3 |
| 2008/0113644 A1 | * | 5/2008 | Trotta | H03D 7/1425 455/333 |
| 2008/0305759 A1 | * | 12/2008 | Tervaluoto | H03D 7/14 455/326 |
| 2010/0093295 A1 | * | 4/2010 | Olson | H03D 3/007 455/182.1 |

(Continued)

*Primary Examiner* — Sonny Trinh
(74) *Attorney, Agent, or Firm* — Womble Bond Dickinson (US) LLP

(57) ABSTRACT

According to one embodiment, a radio frequency (RF) receiver circuit includes a low noise amplifier, a poly-phase filter, and an in-phase quadrature (IQ) mixer circuit coupled between the low noise amplifier and the poly-phase filter. The IQ mixer circuit includes an IQ generator having a differential in-phase input port, a differential in-phase output port, and a differential quadrature output port; a first frequency mixer having a differential local oscillator (LO) input port, where the differential LO input port of the first frequency mixer are coupled to the differential in-phase output port of the IQ generator to drive the first frequency mixer; and a second frequency mixer having a differential LO port, where the differential LO input port of the second frequency mixer are coupled to the differential quadrature output port of the IQ generator to drive the second frequency mixer.

14 Claims, 11 Drawing Sheets

(56) References Cited

U.S. PATENT DOCUMENTS

2013/0281043 A1* 10/2013 Mu .................. H03F 1/223
455/311
2017/0149404 A1* 5/2017 Tsai .................. H01L 23/5223

* cited by examiner

BROADBAND IMAGE-REJECT RECEIVER FOR MULTI-BAND MILLIMETER-WAVE 5G COMMUNICATION

FIELD OF THE INVENTION

Embodiments of the present invention relate generally to wireless communication devices. More particularly, embodiments of the invention relate to a multi-band image-reject receiver for a communication device.

BACKGROUND

For next-generation 5G communication devices, a higher data rate is required for many applications such as augmented reality (AR)/virtual reality (VR), and 5G multiple-input and multiple-output (MIMO). A design shift towards millimeter-wave (mm-Wave) frequency supports this higher data rate. Meanwhile, a broader bandwidth is required to facilitate the higher data rate. For example, a broader bandwidth should cover the 5G spectrum including the 24, 28, 37, and 39 GHz bands.

A low intermediate frequency (IF) receiver architecture may be popular for communication devices to avoid drawbacks from a zero-IF down-conversion receiver such as flicker noise and dc offset. However, mm-Wave wideband in-phase quadrature (IQ) local oscillator (LO) generation for a low-IF receiver can be very lossy degrading performance of down-conversion mixers of the receiver. There is a need for an on-chip receiver with wideband image rejection at mm-Wave frequency.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
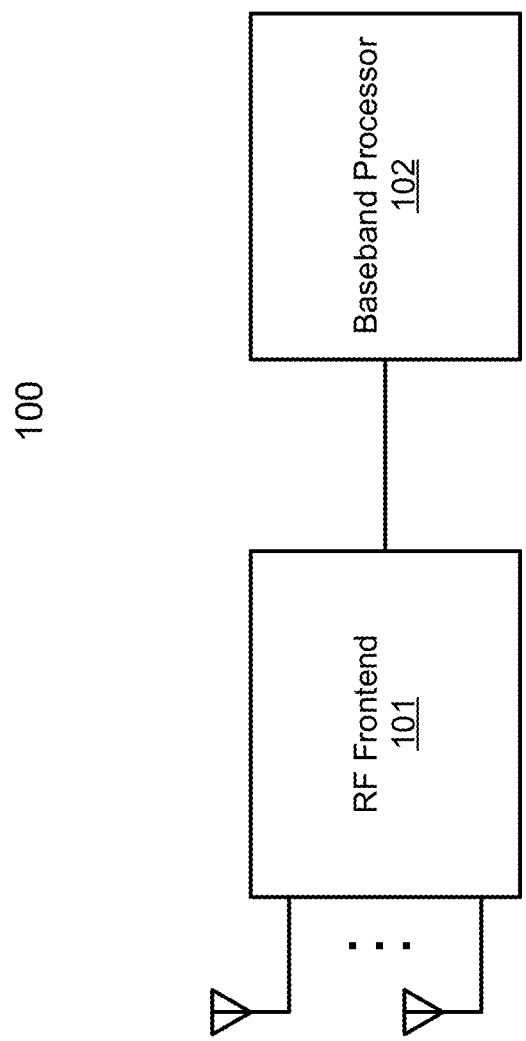
FIG. 1 is a block diagram illustrating an example of a wireless communication device according one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "substantially" herein refers to being within 10% of the target.

For purposes of the embodiments described herein, unless otherwise specified, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, etc., may be used without departing from the scope of the disclosure.

According to some embodiments, a radio frequency (RF) receiver circuit includes a low noise amplifier, a poly-phase filter, and an IQ mixer circuit coupled between the low noise amplifier and the poly-phase filter. The IQ mixer circuit includes an IQ generator having a differential in-phase input port, a differential in-phase output port, and a differential quadrature output port; a first frequency mixer having a differential local oscillator (LO) input port, where the differential LO input port of the first frequency mixer are coupled to the differential in-phase output port of the IQ generator to drive the first frequency mixer; and a second frequency mixer having a differential LO port, where the differential LO input port of the second frequency mixer are coupled to the differential quadrature output port of the IQ generator to drive the second frequency mixer.

In one embodiment, each of the first and the second frequency mixers includes a first stage amplifier, where the first stage amplifier comprises a first differential transistor pair having a first and a second transistor, where a first gate terminal of the first transistor and a second gate terminal of the second transistor together forms a differential RF input port to receive a differential RF input signal to be mixed; and a second stage amplifier coupled to the first stage amplifier, where the second stage amplifier includes a second differential transistor pair having a third transistor with a third gate terminal and a fourth transistor with a fourth gate terminal and a third differential transistor pair having a fifth transistor with a fifth gate terminal and a sixth transistor with a sixth gate terminal, where the third gate terminal is coupled to the fifth gate terminal and the fourth gate terminal is coupled to the sixth gate terminal, where the third gate terminal and the fifth gate terminal forms a differential LO input port to receive a differential LO drive signal to drive the mixer.

In another embodiment, a first drain terminal of the first transistor of the first differential transistor pair is coupled to source terminals of the third and the fourth transistors of the second differential transistor pair via a first inductor, and a second drain terminal of the second transistor of the first differential transistor pair is coupled to source terminals of the fifth and the sixth transistors of the third differential transistor pair via a second inductor, where the first and the second inductors form a differential inductor pair. In another embodiment, a drain terminal of the third transistor is coupled to a drain terminal of the fifth transistor as a first output, a drain terminal of the fourth transistor is coupled to a drain terminal of the sixth transistor as the second output, where the first and the second output forms a differential output port to output a differential mixed signal.

According to another aspect, an RF frontend circuit includes an RF receiver to amplifier a received signal, the RF receiver includes a low noise amplifier, a poly-phase filter, and an IQ mixer circuit coupled between the low noise amplifier and the poly-phase filter. The IQ mixer circuit includes an IQ generator having a differential in-phase input port, a differential in-phase output port, and a differential quadrature output port; a first frequency mixer having a differential LO input port, where the differential LO input port of the first frequency mixer are coupled to the differential in-phase output port of the IQ generator to drive the first frequency mixer; and a second frequency mixer having a differential LO port, where the differential LO input port of the second frequency mixer are coupled to the differential quadrature output port of the IQ generator to drive the second frequency mixer.

FIG. 1 is a block diagram illustrating an example of a wireless communication device according one embodiment of the invention. Referring to FIG. 1, wireless communication device 100, also simply referred to as a wireless device, includes, amongst others, an RF frontend module 101 and a baseband processor 102. Wireless device 100 can be any kind of wireless communication devices such as, for example, mobile phones, laptops, tablets, network appliance devices (e.g., Internet of thing or IOT appliance devices), etc.

In a radio receiver circuit, the RF frontend is a generic term for all the circuitry between the antenna up to and including the mixer stage. It consists of all the components in the receiver that process the signal at the original incoming radio frequency, before it is converted to a lower frequency, e.g., IF. In microwave and satellite receivers it is often called the low-noise block (LNB) or low-noise downconverter (LND) and is often located at the antenna, so that the signal from the antenna can be transferred to the rest of the receiver at the more easily handled intermediate frequency. A baseband processor is a device (a chip or part of a chip) in a network interface that manages all the radio functions (all functions that require an antenna).

In one embodiment, RF frontend module 101 includes one or more RF transceivers, where each of the RF transceivers transmits and receives RF signals within a particular frequency band (e.g., a particular range of frequencies such as non-overlapped frequency ranges) via one of a number of RF antennas. The RF frontend IC chip further includes an IQ generator and/or a frequency synthesizer coupled to the RF transceivers. The IQ generator or generation circuit generates and provides an LO signal to each of the RF transceivers to enable the RF transceiver to mix, modulate, and/or demodulate RF signals within a corresponding frequency band. The RF transceiver(s) and the IQ generation circuit may be integrated within a single IC chip as a single RF frontend IC chip or package.

Figure 2:
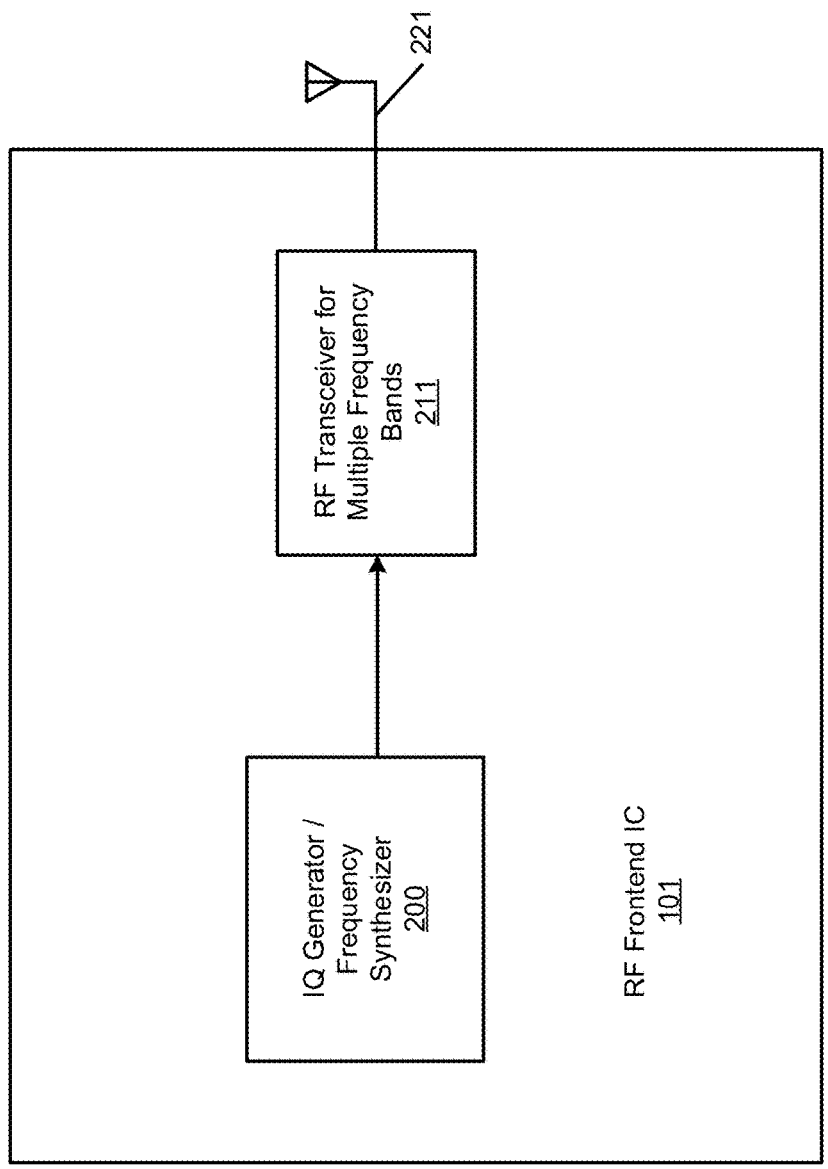
FIG. 2 is a block diagram illustrating an example of an RF frontend integrated circuit according to one embodiment.

FIG. 2 is a block diagram illustrating an example of an RF frontend integrated circuit according to one embodiment of the invention. Referring to FIG. 2, RF frontend 101 includes, amongst others, an IQ generator and/or frequency synthesizer 200 coupled to a multi-band RF transceiver 211. Transceiver 211 is configured to transmit and receive RF signals within one or more frequency bands or a broad range of RF frequencies via RF antenna 221. In one embodiment, transceiver 211 is configured to receive one or more LO signals from IQ generator and/or frequency synthesizer 200. The LO signals are generated for the one or more corresponding frequency bands. The LO signals are utilized to mix, modulate, demodulated by the transceiver for the purpose of transmitting and receiving RF signals within corresponding frequency bands. Although there is only one transceiver and antenna shown, multiple pairs of transceivers and antennas can be implemented, one for each frequency bands.

Figure 3:
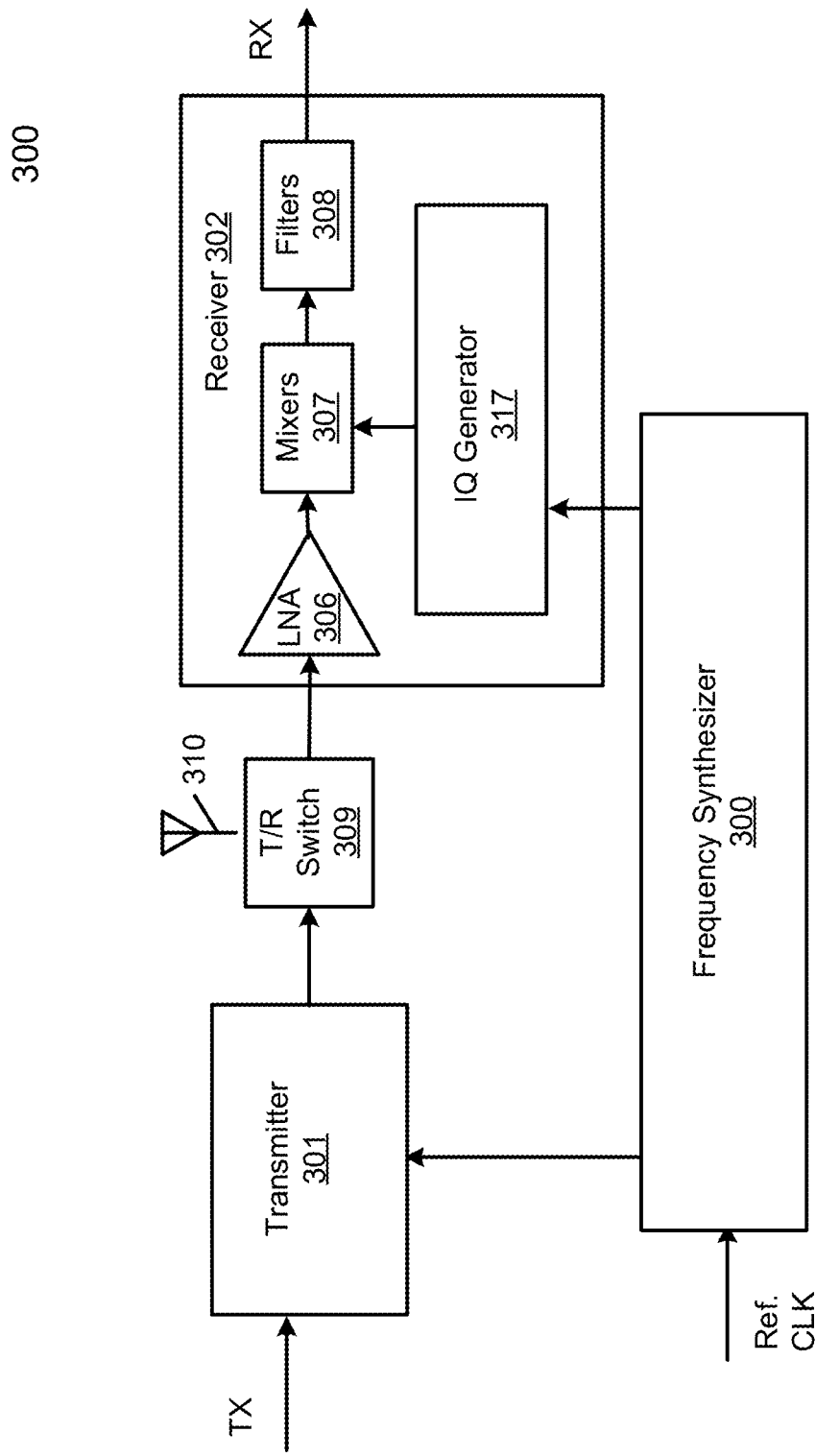
FIG. 3 is a block diagram illustrating an RF transceiver integrated circuit according to one embodiment.

FIG. 3 is a block diagram illustrating an RF transceiver integrated circuit (IC) according to one embodiment. RF transceiver 300 may represent RF transceiver 211 of FIG. 2. Referring to FIG. 3, frequency synthesizer 300 may represent frequency synthesizer 200 as described above. In one embodiment, RF transceiver 300 can include frequency synthesizer 300, transmitter 301, and receiver 302. Frequency synthesizer 300 is communicatively coupled to transmitter 301 and receiver 302 to provide LO signals. Transmitter 301 can transmit RF signals for a number of frequency bands. Receiver 302 can receive RF signals for a number of frequency bands.

Receiver 302 includes a low noise amplifier (LNA) 306, mixer(s) 307, and filter(s) 308. LNA 306 is to receive RF signals from a remote transmitter via antenna 310 and to amplify the received RF signals. The amplified RF signals are then demodulated by mixer(s) 307 (also referred to as a down-convert mixer) based on an LO signal provided by IQ generator 317. IQ generator 317 may represent IQ generator 200 as described above. In one embodiment, IQ generator 317 is integrated into broadband receiver 302 as a single integrated circuit. The demodulated signals are then processed by filter(s) 308, which may be a low-pass filter. In one embodiment, transmitter 301 and receiver 302 share antenna 310 via a transmitting and receiving (T/R) switch 309. T/R switch 309 is configured to switch between transmitter 301 and receiver 302 to couple antenna 310 to either transmitter 301 or receiver 302 at a particular point in time. Although there is one pair of transmitter and receiver shown, multiple pairs of transmitters and receivers and/or a standalone receiver can be implemented.

Figure 4:
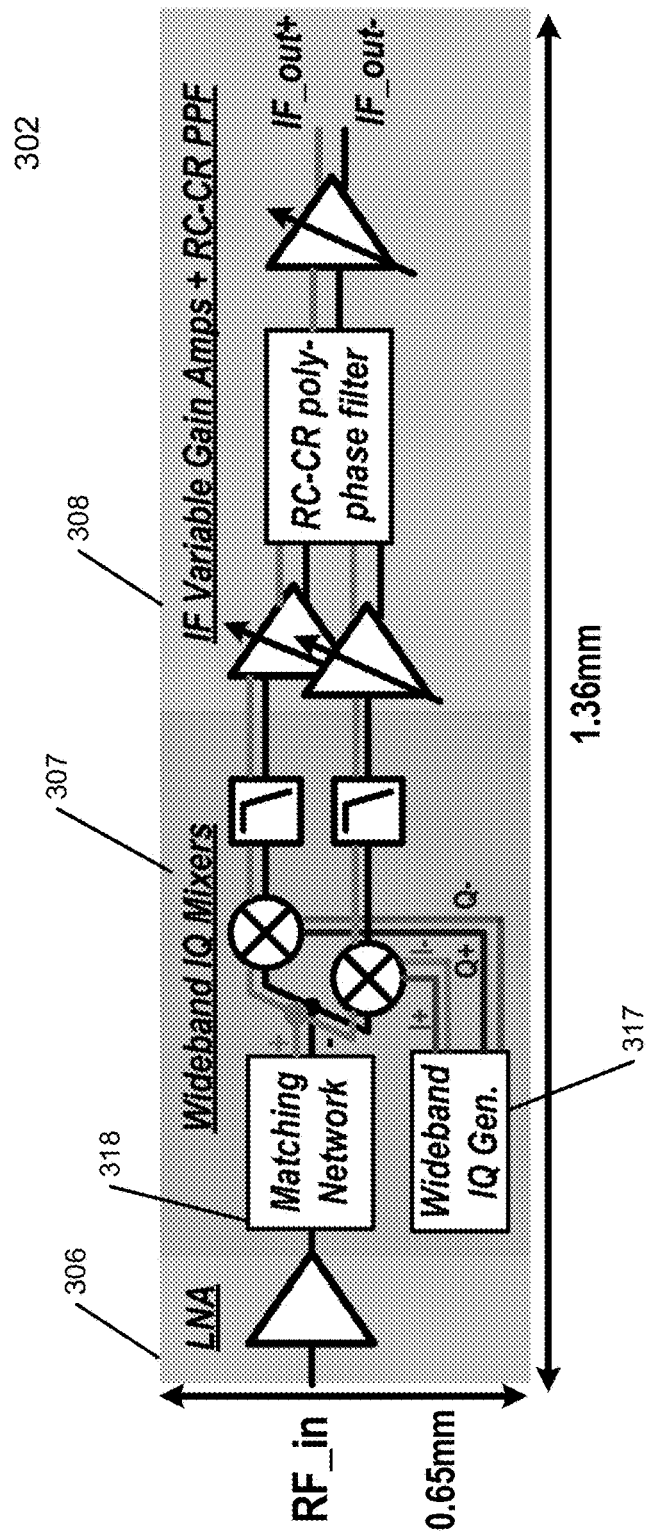
FIG. 4 is a block diagram illustrating an example of a wideband receiver circuit according to one embodiment.

FIG. 4 is a block diagram illustrating an example of a wideband LNA 306, wideband IQ mixers 307, and filter 308. Filter 308 can be a two-stage resistors capacitors (e.g., RC-CR) poly-phase filter. Filter 308 can include one or more variable gain intermediate frequency (IF) amplifiers for additional power gain. Note wideband IQ mixers 307 can be co-designed with wideband IQ generation circuit 317 as a single unit. Wideband IQ mixers 307 can also include a matching network 318 for impedance matching between LNA 306 and mixers 307.

Figure 5:
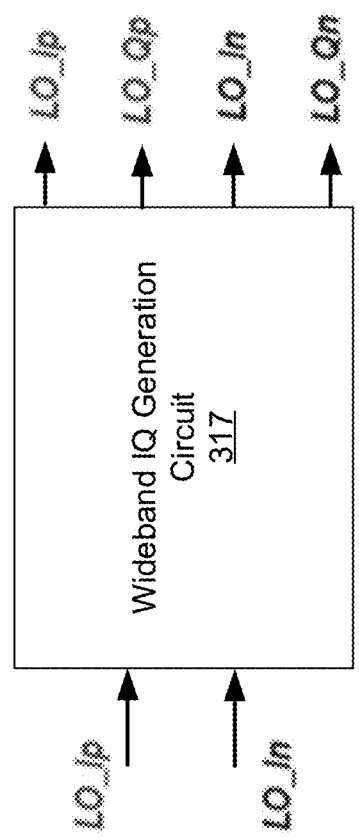
FIG. 5 is a block diagram illustrating a wideband IQ generation circuit according to one embodiment.

FIG. 5 is a block diagram illustrating a mm-wave wideband IQ generation circuit according to one embodiment. Referring to FIG. 5, wideband IQ generation circuit 317 can generate IQ signals (e.g., LO_Ip, LO_Qp, LO_In, and LO_Qn) based on a differential LO signal (e.g., LO_Ip and LO_In) over a wide range of frequencies. The IQ generation circuit 317 introduces 90 degrees phase shift to the LO signals to generate signals in the four phase quadrants. IQ signals can then be used by an IQ mixer to modulate RF signals having IQ data to a lower frequency signal (e.g., IF signal).

Figure 6:
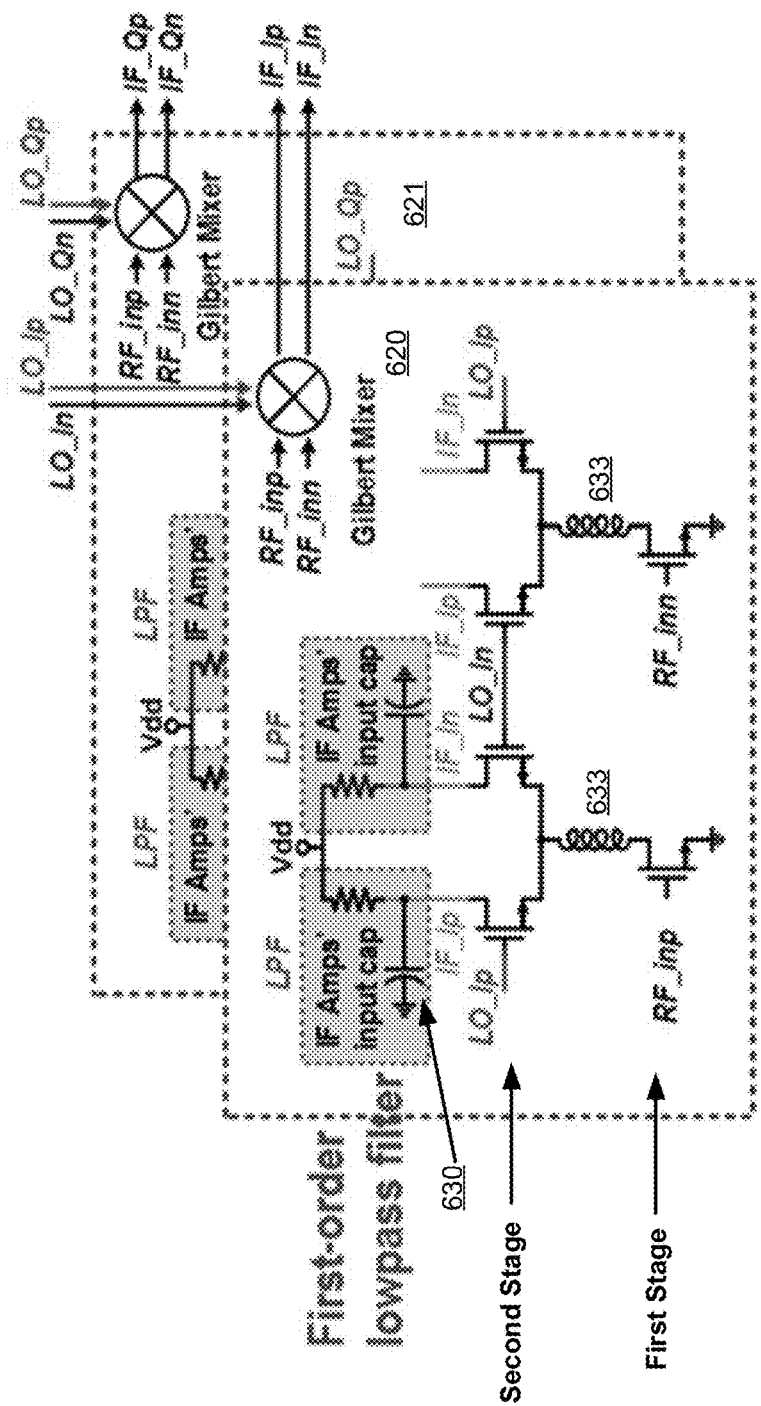
FIG. 6 is a block diagram illustrating broadband IQ mixers according to one embodiment.

FIG. 6 is a block diagram illustrating broadband IQ mixers according to one embodiment. A mixer is a three port device that can perform a frequency conversion or modulation of a signal. For a receiver, a mixer down converts (or demodulates) an RF signal using an LO signal to generate an IF signal. Referring to FIG. 6, mixers 307 includes two (or double) balanced Gilbert mixers 620-621. Double balanced mixers 620-621 down convert (or demodulate) a differential RF signal using differential LO signals to generate differential IF signals. For example, mixer 620 receives RF_inp, RF_inn, and differential in-phase signals (e.g., LO_Ip and LO_In) generated by a mm-wave wideband IQ generation circuit, such as IQ generator 317 of FIG. 5, to generate IF_Ip and IF_In. Similarly, mixer 621 receives RF_inp, RF_inn, and differential quadrature signals (e.g., LO_Qp and LO_Qn) generated by a mm-wave wideband IQ generation circuit, such as IQ generator 317 of FIG. 5, to generate IF_Qp and IF_Qn. In some embodiments, each of mixers 620-621 can include one or more differential amplifier stages.

Referring to FIG. 6, for a two stage differential amplifier, the amplifier can include a common source differential amplifier as the first stage and a gate-coupled differential amplifier as the second stage. The common source differential amplifier stage of mixers 620-621 each can receive differential signals RF_inp and RF_inn. The gate-coupled differential amplifier stage of mixer 620 receives differential signals LO_In and LO_Ip. The gate-coupled differential amplifier stage of mixer 621 receives differential signals LO_Qn and LO_Qp. The RF signal is then down converted by the LO signal to generate an IF signal. The second stage can include a low-pass filter which can be first order low-pass filters to minimize high frequency noise injections into mixers 620-621. In one embodiment, the low-pass filter includes a passive low pass filter having a load resistor in parallel with a capacitor (e.g., capacitor 630). In one embodiment, the first stage different amplifier is coupled to the second stage differential amplifier via differential inductors (e.g., differential inductors 633). In one embodiment, mixers 620-621 is co-designed with a mm-wave IQ generation circuit such as mm-wave IQ generation circuit 317 of FIG. 5 on a single monolithic integrated circuit.

Figure 7B:
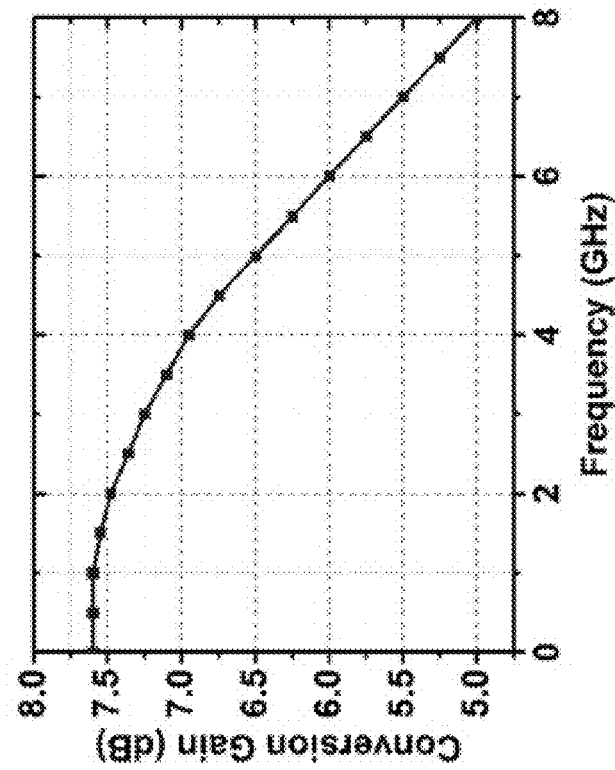
FIG. 7B illustrates a simulation graph for conversion gain versus intermediate frequency (IF) between 0 to 8 GHz for a co-designed mm-wave IQ generation circuit of FIG. 5 and broadband IQ mixer of FIG. 6 according to one embodiment.
Figure 7A:
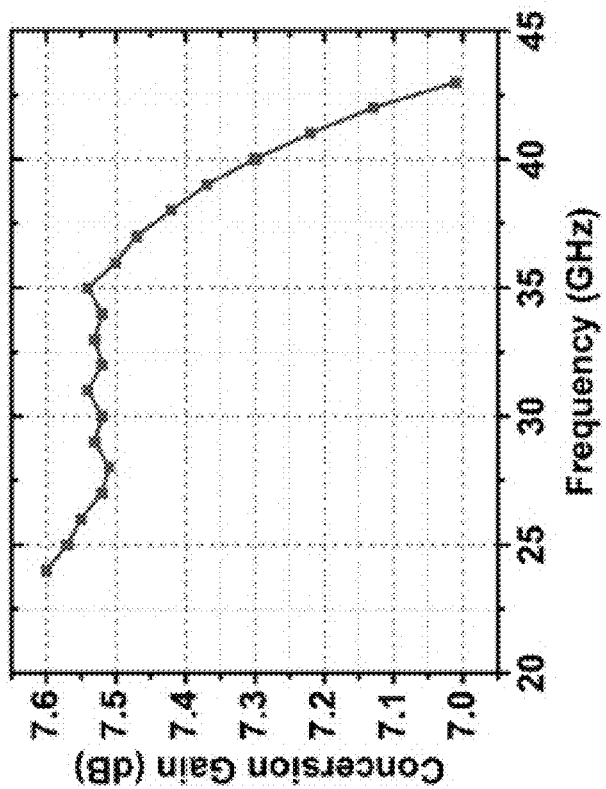
FIG. 7A illustrates a simulation graph for conversion gain versus local oscillator (LO) frequency between 20 to 45 GHz for a co-designed mm-wave IQ generation circuit of FIG. 5 and broadband IQ mixer of FIG. 6 according to one embodiment.

FIG. 7A illustrates a simulation graph for conversion gain versus local oscillator (LO) frequency between 20 to 45 GHz for a co-designed mm-wave IQ generation circuit of FIG. 5 and broadband IQ mixer of FIG. 6 according to one embodiment. Referring to FIG. 7A, With a moderate differential power such as a LO signal with a differential power of about −2 dBm at the input of the IQ generation circuit, IQ mixers 307 can yield a down-conversion gain of approximately >7 dB and an amplitude mismatch of approximately <0.7 dB over a LO frequency range of 23 to 43 GHz.

FIG. 7B illustrates a simulation graph for conversion gain versus intermediate frequency (IF) between 0 to 8 GHz for a co-designed mm-wave IQ generation circuit of FIG. 5 and broadband IQ mixer of FIG. 6 according to one embodiment. Referring to FIG. 6, output load resistors of the mixer 620/621 can be co-designed in parallel with input capacitors 630, which may be parasitic capacitances seen at a next IF amplifier stage, e.g., IF variable gain amplifier stage 308 of FIG. 4, to form a first-order low pass filter. Referring to FIG. 7B, based on the co-designed mm-wave IQ generation circuit and IQ mixers, a conversion gain degradation can be reduced to about 0.5 dB from a peak gain of about 7.6 dB for an IF frequency designed at about 3.5 GHz.

Figure 8:
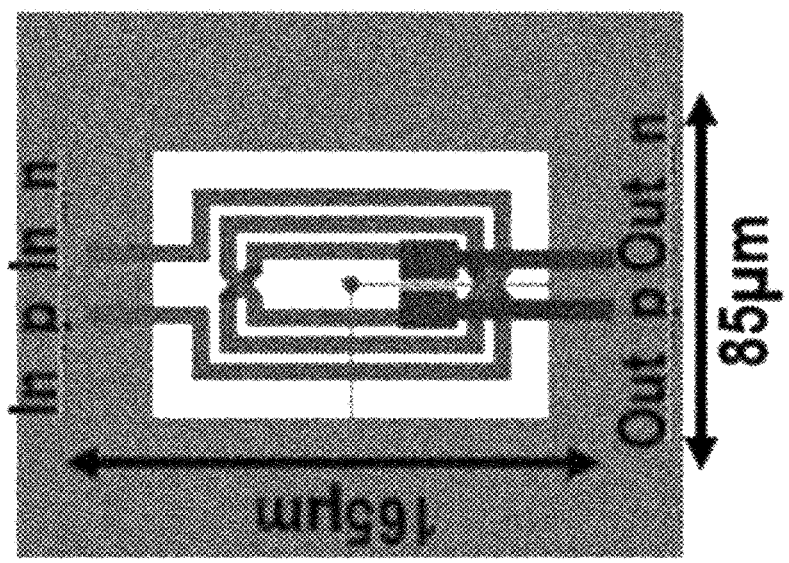
FIG. 8 illustrates a three dimensional model of a differential inductor pair according to one embodiment.

Referring to FIG. 6, differential inductor pair 633 is used to pick up a current gain between the two differential amplifier stages. Four inductors are included for good performance, e.g., two differential inductor pairs are used for each of the double IQ mixers. Four inductors, however, include a large foot. FIG. 8 illustrates a three dimensional model of a differential inductor pair according to one embodiment. Differential inductor pair 800 may be differential inductor pair 633 of FIG. 6. In one embodiment, a differential inductor pair can be reduced to a single inductor footprint, such as differential inductor pair 800 of FIG. 8. Referring to FIG. 8, differential inductor pair 800 includes two spiral inductors folded together into a footprint of a single inductor due to the fact that there is a virtual ground between the inductor pairs, and thus, a ground plane (e.g., a ground plane surrounding the inductors) can be reused for the pair of inductors to reduce the inductor pair footprint. In one embodiment, differential inductor pair 800 can each have about 200 pH of inductance. In one embodiment, the inductor pair has a footprint of about 165 µm by 85 µm.

Figure 9:
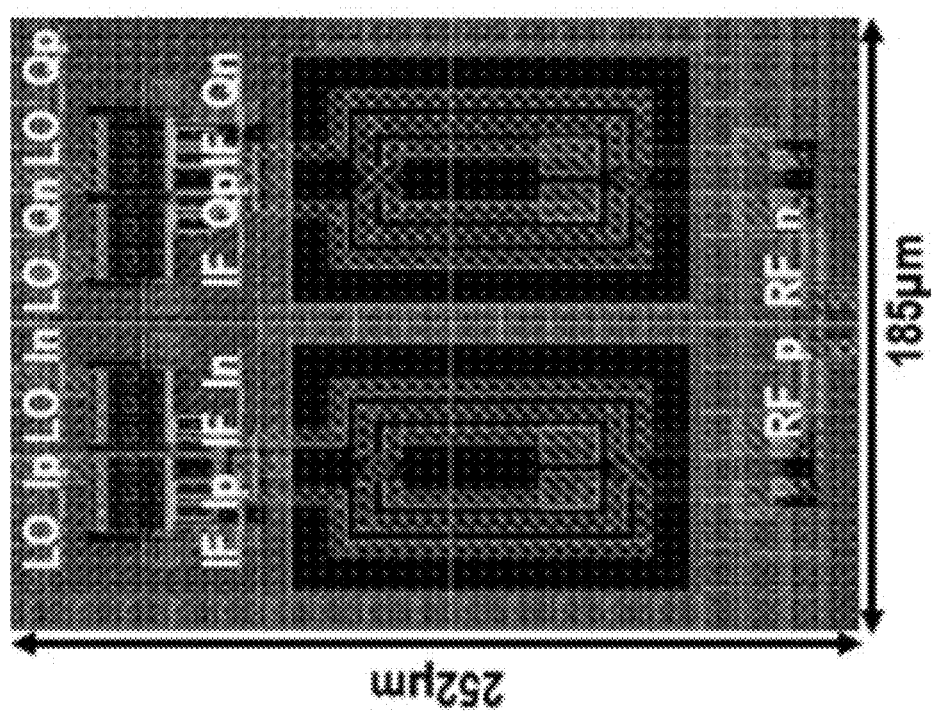
FIG. 9 illustrates a layout model of a double balanced mixer each with a differential inductor pair according to one embodiment.
Figure 10:
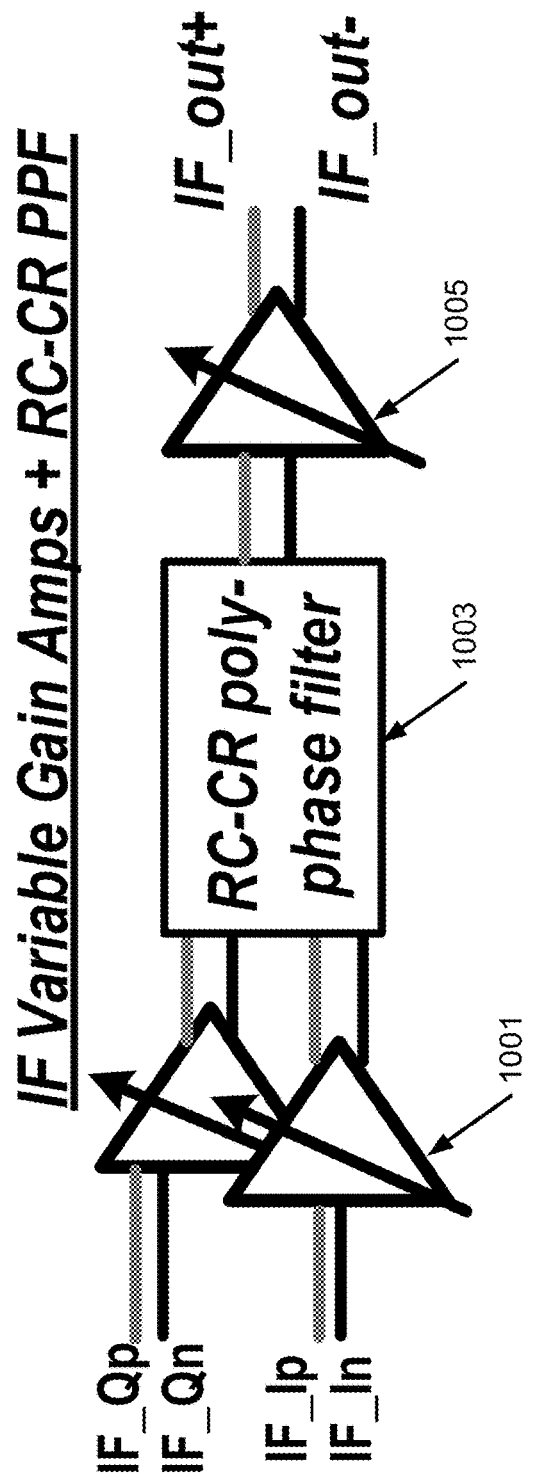
FIG. 10 is a block diagram illustrating a poly-phase filter (PPF) circuit according to one embodiment.

FIG. 9 illustrates a layout model of a double balanced mixer each with a differential inductor pair of FIG. 8 according to one embodiment. Referring to FIG. 9, double balanced mixer 900 can be IQ mixers 620-621 of FIG. 6. As shown by FIG. 9, two inductor pairs (e.g., 4 inductors in total) are each coupled between a first stage amplifier and a second stage amplifier. The inductor pair applies an inductance between the two stages to enhance a current gain over a mm-wave frequency range. The inductors of the differential inductor pair share a virtual ground and have a single inductor footprint. In one embodiment, the mixer footprint is approximately 185 µm by 252 µm. FIG. 10 is a block diagram illustrating a poly-phase filter (PPF) circuit according to one embodiment. PPF 308 can filter out higher frequency noise and can recombine the four in-phase and quadrature signals back into a differential pair of IF signals, e.g., IF_Ip and IF_In. In one embodiment, PPF 308 includes one or more amplifier stages to further amplify an IF signal. Referring to FIG. 10, in one embodiment, PPF 308 includes three stages. A first stage includes differential amplifiers 1001 to increase the power of the IQ IF signals, e.g., IF_Ip, IF_In, IF_Qp, and IF_Qn. A second stage includes a resistive-capacitive capacitive-resistive (RC_CR) PPF 1003. PPF 1003 can filter out undesirable signal noise, e.g., high frequency noise outside the range of the IF frequencies, and can combine the four in-phase and quadrature signals, e.g., IF_Ip, IF_In, IF_Qp, and IF_Qn, into a differential pair of IF signals, e.g., IF_Ip and IF_In. Finally, a third stage includes an amplifier 1005 to further amplify the differential IF signals IF_Ip and IF_In to generate IF_out+ and IF_out−. Amplifiers 1001 and amplifiers 1005 can be variable gain amplifiers to allow for gain adjustments for the PPF circuit 308.

Figure 11:
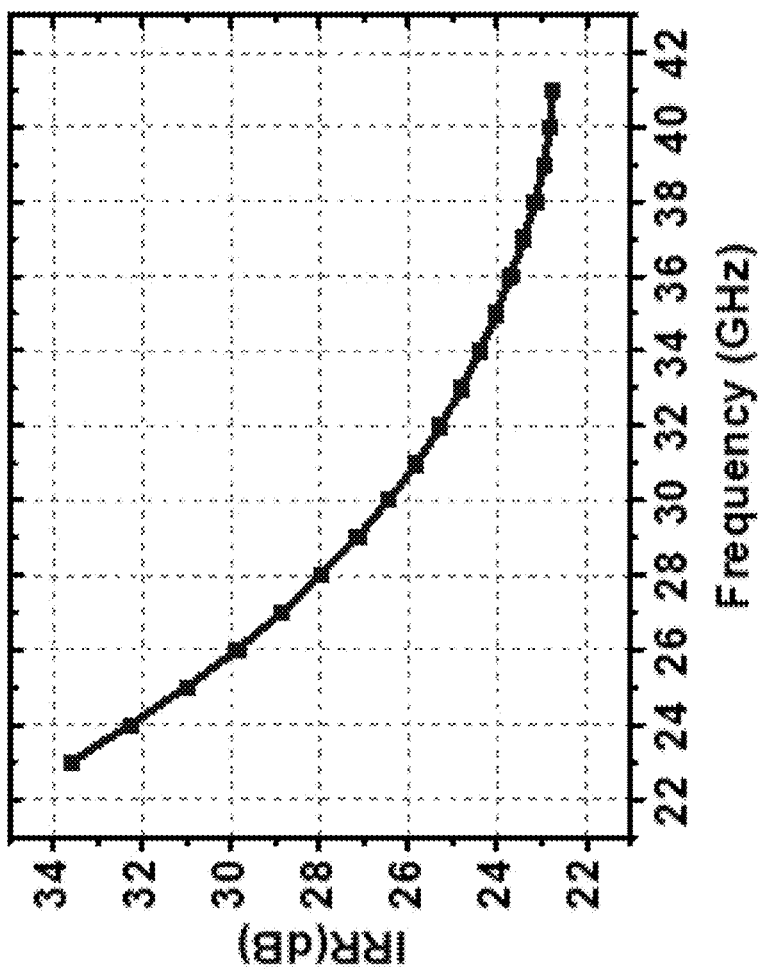
FIG. 11 is a simulation graph illustrating image rejection ratio vs RF frequency from 22 to 39 GHz under a fixed IF frequency of 3.5 GHz for the wideband receiver circuit of FIG. 4, according to one embodiment.

FIG. 11 is a simulation graph illustrating image rejection ratio vs RF frequency from 22 to 39 GHz under an IF frequency of approximately 3.5 GHz for the broadband receiver circuit (e.g., receiver 302) of FIG. 4, according to one embodiment. The simulation setup includes a differential LO with a driving power ranging from −2 to +3 dBm as the input. Under the IF frequency of approximately 3.5 GHz, the wideband imaging rejection ratio (IRR) is approximately >23 dB for a frequency range of about 22 to 39 GHz. Broadband receiver 302 occupies approximately 1.36 mm by 0.65 mm according to one embodiment. An overall performance of RF receiver circuit 302 is illustrated in Table 1, according to one embodiment.

TABLE I

Performance Summary of Wideband Receiver Circuit 302

| Overall RX | 3 dB Bandwidth | 24 G~39 GHz |
|---|---|---|
| | Conversion Gain | 36~39 dB |
| | Pin 1 dB | −30.4~−33.3 dBm |
| | Noise Figure | 2.82~4.5 dB |
| | Power Consumption | 96.4 mW |
| LNA | 3 dB Bandwidth | 24 G~41 GHz |
| | Gain | 18~21 dB |
| | Pin 1 dB | −18~−21 dBm |
| | Noise Figure | 2.48~4.2 dB |
| | Power Consumption | 27.6 mW |
| Mixer | Conversion Gain | 7.6~10 dB |
| | Pin 1 dB | −7 dBm |
| | Power Consumption | 22 mW |
| IF Amps + RC-CR | Gain, 3 bits | 2~11 dB |
| | Pin 1 dB | −8 dBm |
| PPF | Power Consumption | 46.8 mW |

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A radio frequency (RF) receiver circuit, the RF receiver circuit comprising:
   a low noise amplifier;
   a poly-phase filter; and
   an in-phase quadrature (IQ) mixer circuit coupled between the low noise amplifier and the poly-phase filter, wherein the IQ mixer circuit comprises:
      an IQ generator having a differential in-phase input port, a differential in-phase output port, and a differential quadrature output port;
      a first frequency mixer having a first differential local oscillator (LO) input port, wherein the first differential LO input port of the first frequency mixer is coupled to the differential in-phase output port of the IQ generator to drive the first frequency mixer; and
      a second frequency mixer having a second differential LO input port, wherein the second differential LO input port of the second frequency mixer is coupled to the differential quadrature output port of the IQ generator to drive the second frequency mixer, wherein the first and the second frequency mixers each comprises: a first stage amplifier and a second stage amplifier, wherein the first stage amplifier is coupled to the second stage amplifier through a differential inductor pair including a first inductor and a second inductor, and wherein the differential inductor pair has a single inductor footprint sharing a common virtual ground.

2. The RF receiver circuit of claim 1, wherein the first stage amplifier comprises a first differential transistor pair having a first transistor and a second transistor, wherein a first gate terminal of the first transistor and a second gate terminal of the second transistor together forms a differential RF input port to receive a differential RF input signal to be mixed; and
   wherein the second stage amplifier comprises a second differential transistor pair having a third transistor with a third gate terminal and a fourth transistor with a fourth gate terminal and a third differential transistor pair having a fifth transistor with a fifth gate terminal and a sixth transistor with a sixth gate terminal, wherein the third gate terminal is coupled to the fifth gate terminal and the fourth gate terminal is coupled to the sixth gate terminal, wherein the third gate terminal and the fifth gate terminal form a differential LO input port to receive a differential LO drive signal to drive the mixer.

3. The RF receiver circuit of claim 2, wherein a first drain terminal of the first transistor of the first differential transistor pair is coupled to source terminals of the third and the fourth transistors of the second differential transistor pair via the first inductor, and a second drain terminal of the second transistor of the first differential transistor pair is coupled to source terminals of the fifth and the sixth transistors of the third differential transistor pair via the second inductor.

4. The RF receiver circuit of claim 2, wherein a drain terminal of the third transistor is coupled to a drain terminal of the fifth transistor as a first output, a drain terminal of the fourth transistor is coupled to a drain terminal of the sixth transistor as a second output, wherein the first output and the second output form a differential output port to output a differential mixed signal.

5. The RF receiver circuit of claim 4, wherein the third and the fourth transistors of the second differential transistor pair are each coupled to a low pass filter.

6. The RF receiver circuit of claim 5, wherein the low pass filter includes a load resistor coupled to a capacitor in parallel.

7. The RF receiver circuit of claim 6, wherein the capacitor is a parasitic capacitance of a next amplifier stage seen by the second differential transistor pair.

8. A radio frequency (RF) frontend circuit comprising a RF receiver to amplifier a received signal, the RF receiver comprising:
- a low noise amplifier;
- a poly-phase filter; and
- an in-phase quadrature (IQ) mixer circuit coupled between the low noise amplifier and the poly-phase filter, wherein the IQ mixer circuit comprises:
  - an IQ generator having a differential in-phase input port, a differential in-phase output port, and a differential quadrature output port;
  - a first frequency mixer having a first differential local oscillator (LO) input port, wherein the first differential LO input port of the first frequency mixer is coupled to the differential in-phase output port of the IQ generator to drive the first frequency mixer; and
  - a second frequency mixer having a second differential LO input port, wherein the second differential LO input port of the second frequency mixer is coupled to the differential quadrature output port of the IQ generator to drive the second frequency mixer, wherein the first and the second frequency mixers each comprises: a first stage amplifier and a second stage amplifier, wherein the first stage amplifier is coupled to the second stage amplifier through a differential inductor pair including a first inductor and a second inductor, and wherein the differential inductor pair has a single inductor footprint sharing a common virtual ground.

9. The RF frontend circuit of claim 8,
wherein the first stage amplifier comprises a first differential first transistor pair having a first and a second transistor, wherein a first gate terminal of the first transistor and a second gate terminal of the second transistor together form a differential RF input port to receive a differential RF input signal to be mixed; and
wherein the second stage amplifier comprises a second differential transistor pair having a third transistor with a third gate terminal and a fourth transistor with a fourth gate terminal and a third differential transistor pair having a fifth transistor with a fifth gate terminal and a sixth transistor with a sixth gate terminal, wherein the third gate terminal is coupled to the fifth gate terminal and the fourth gate terminal is coupled to the sixth gate terminal, wherein the third gate terminal and the fifth gate terminal form a differential LO input port to receive a differential LO drive signal to drive the mixer.

10. The RF frontend circuit of claim 9, wherein a first drain terminal of the first transistor of the first differential transistor pair is coupled to source terminals of the third and the fourth transistors of the second differential transistor pair via the first inductor, and a second drain terminal of the second transistor of the first differential transistor pair is coupled to source terminals of the fifth and the sixth transistors of the third differential transistor pair via the second inductor.

11. The RF frontend circuit of claim 9, wherein a drain terminal of the third transistor is coupled to a drain terminal of the fifth transistor as a first output, a drain terminal of the fourth transistor is coupled to a drain terminal of the sixth transistor as a second output, wherein the first and the second output form a differential output port to output a differential mixed signal.

12. The RF frontend circuit of claim 11, wherein the third and the fourth transistors of the second differential transistor pair are each coupled to a low pass filter.

13. The RF frontend circuit of claim 12, wherein the low pass filter includes a load resistor coupled to a capacitor in parallel.

14. The RF frontend circuit of claim 13, wherein the capacitor is a parasitic capacitance of a next amplifier stage seen by the second differential transistor pair.

* * * * *